(12) United States Patent
Chiba et al.

(10) Patent No.: US 7,208,338 B2
(45) Date of Patent: Apr. 24, 2007

(54) METHOD OF MANUFACTURING SEMICONDUCTOR LIGHT EMITTING DEVICE

(75) Inventors: Mari Chiba, Miyagi (JP); Hisashi Kudo, Miyagi (JP); Shinichi Agatsuma, Miyagi (JP)

(73) Assignee: Sony Corporation, Tokyo (JP)

( * ) Notice: Subject to any disclaimer, the term of this patent is extended or adjusted under 35 U.S.C. 154(b) by 159 days.

(21) Appl. No.: 11/008,484

(22) Filed: Dec. 9, 2004

(65) Prior Publication Data

US 2005/0208770 A1    Sep. 22, 2005

(30) Foreign Application Priority Data

Dec. 18, 2003   (JP) ............................ P2003-421378

(51) Int. Cl.
*H01L 21/00* (2006.01)
*H01L 29/22* (2006.01)
*H01L 33/00* (2006.01)

(52) U.S. Cl. ............................ 438/45; 438/46; 438/47; 438/503; 438/505; 257/94; 257/95; 257/96; 257/97; 257/201

(58) Field of Classification Search .................. None
See application file for complete search history.

(56) References Cited

U.S. PATENT DOCUMENTS

| 5,101,246 | A | * | 3/1992 | Onodera ...................... 257/82 |
| 6,072,819 | A | * | 6/2000 | Shakuda .................. 372/46.01 |
| 6,238,947 | B1 | * | 5/2001 | Shakuda ...................... 438/94 |
| 6,399,407 | B1 | * | 6/2002 | O'Brien et al. ............... 438/29 |
| 6,711,191 | B1 | * | 3/2004 | Kozaki et al. ........... 372/43.01 |
| 6,777,258 | B1 | * | 8/2004 | Hunter ......................... 438/48 |

* cited by examiner

*Primary Examiner*—Duy-Vu N. Deo
(74) *Attorney, Agent, or Firm*—Sonnenschein Nath & Rosenthal LLP (57) ABSTRACT

A method of manufacturing a ridge type semiconductor light emitting device includes: a process of epitaxially growing a multi-layered semiconductor layer having at least a first conductive type cladding layer, an active layer, a second conductive type first cladding layer, an etching stop layer, and a second conductive type second cladding layer on a substrate; a process of forming a ridge groove for forming a ridge; and a process of forming a current-flow barrier layer in the ridge groove. The process of forming ridge grooves has first and second anisotropic etching processes of performing anisotropic etching, an etching-mask forming process, and an isotropic etching process of performing anisotropic etching.

4 Claims, 10 Drawing Sheets

METHOD OF MANUFACTURING SEMICONDUCTOR LIGHT EMITTING DEVICE

CROSS REFERENCES TO RELATED APPLICATIONS

The present invention claims priority to its priority document No. 2003-421378 filed in the Japanese Patent Office on Dec. 18, 2003, the entire contents of which being incorporated by reference herein.

BACKGROUND OF THE INVENTION

1. Field of the Invention

The present invention relates to a method of manufacturing a semiconductor light emitting device whose thermal saturation level and kink level are improved, and more particularly to a method of manufacturing a semiconductor light emitting device having ridges, i.e. stripe sections constituting current paths.

2. Description of the Related Art

Hitherto, in the manufacture of semiconductor light emitting devices, for example, semiconductor lasers, grooves of desired shapes have often been formed (for example, see Japanese Patent Application Publication 2003-60307, Paragraph 0030).

Figure 9A:
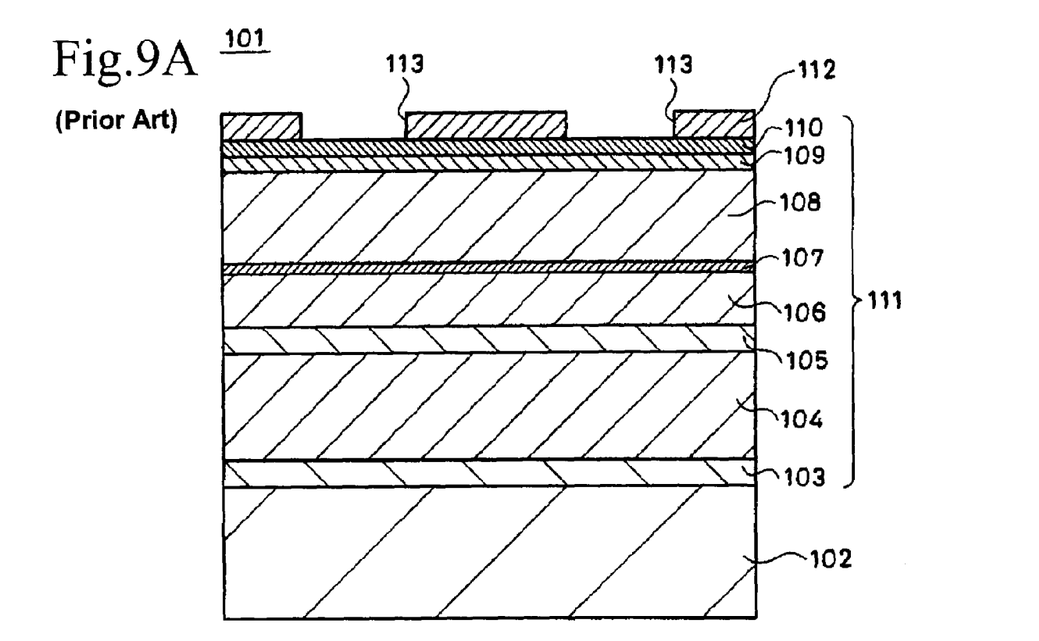
FIGS. 9A and 9B are views illustrating processes in a method of manufacturing a semiconductor light emitting device of related art.
Figure 9B:
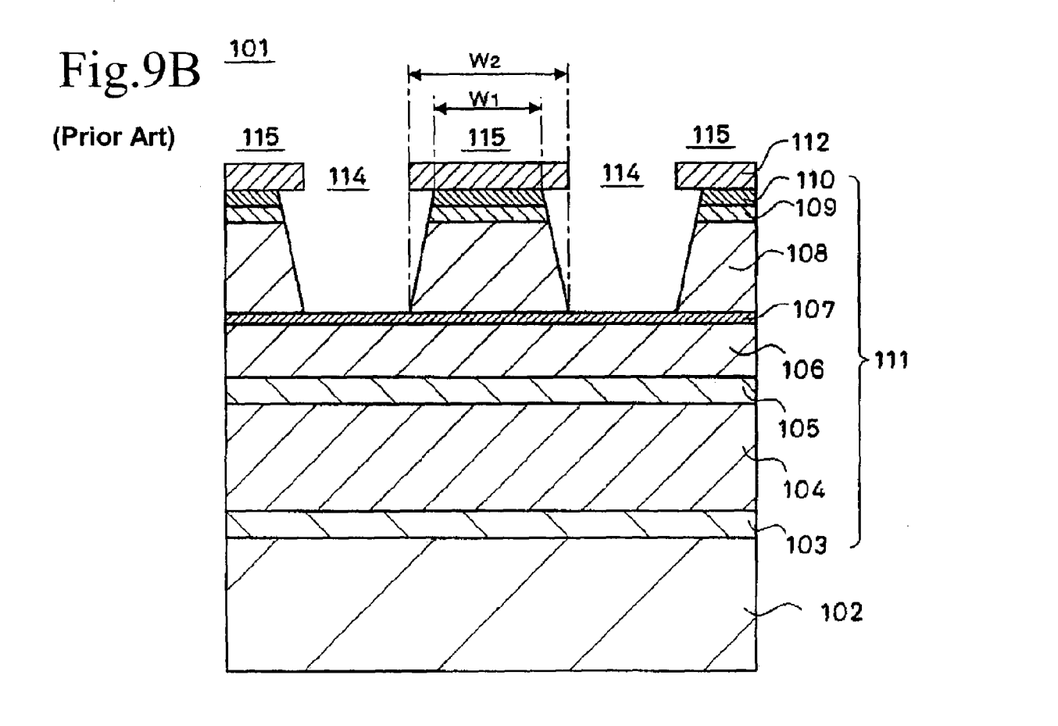
Figure 10A:
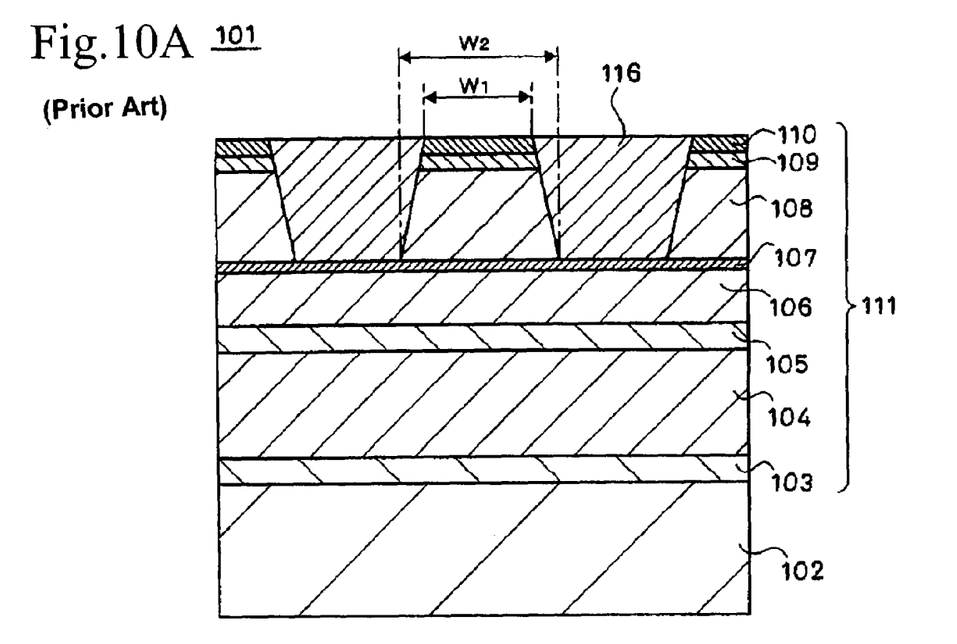
FIGS. 10A and 10B are views illustrating processes in a method of manufacturing a semiconductor light emitting device of related art.
Figure 10B:
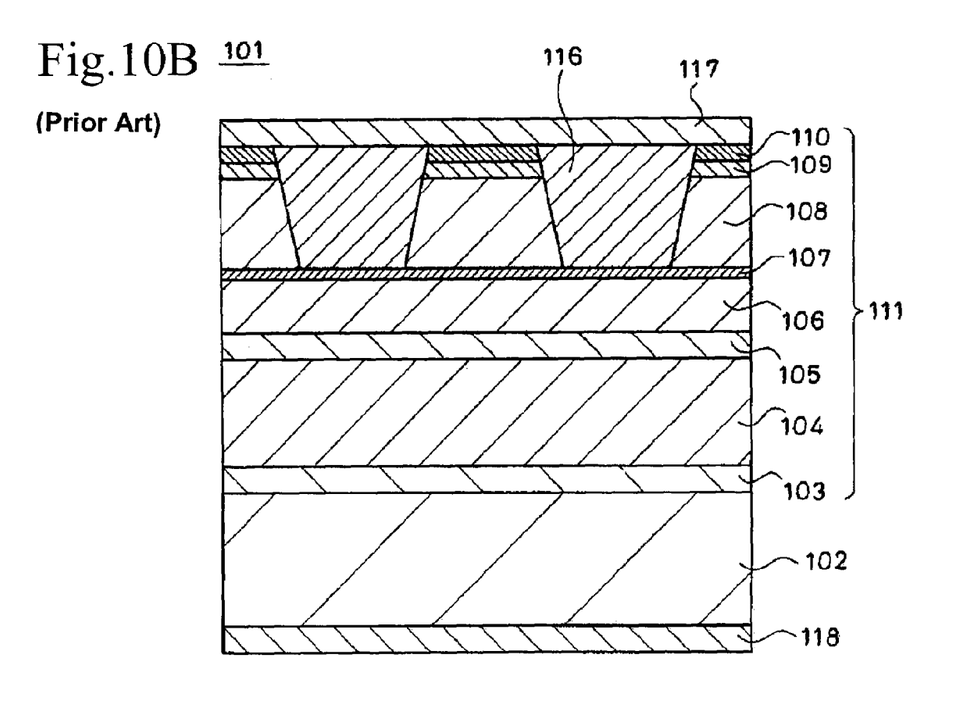

Usually, the formation of grooves is performed by anisotropic etching or isotropic etching, as illustrated in, for instance, schematic cross-sectional views of FIGS. 9 and 10.

First, a first conductive type buffer layer 103, a first conductive type cladding layer 104, an active layer 105, a second conductive type (for example, a p-type) first cladding layer 106, a second conductive type etching stop layer 107, a second conductive type second cladding layer, a second conductive type intermediate layer 109, and a second conductive type cap layer 110 are sequentially formed on a first conductive type (for example, an n-type) semiconductor substrate by epitaxial growth through, for example, MOCVD (Metal Organic Chemical Vapor Deposition). Thus, a multi-layered semiconductor layer 111 is formed.

Subsequently, as illustrated in FIG. 9A, a mask layer 112 made of SiO$_2$ serving as an etching mask in the next process is formed on the cap layer 110 of the multi-layered semiconductor layer 111. This mask layer is pattern-etched to thereby form openings 113 in a ridge groove formation section.

Next, as illustrated in FIG. 9B, a ridge groove 114 is formed by wet etching using, for example, a sulfate-based etchant in such a way as to extend across the cap layer 110, the intermediate layer 109, and the second conductive type second cladding layer 108 of the multi-layered semiconductor layer 111 to the etching stop layer 107.

Next, the mask layer 112 is removed. Further, as illustrated in FIG. 10A, first conductive type GaAs buried layers 116 are formed. Then, as illustrated in FIG. 10B, a first electrode 117 is formed in such a way as to thoroughly cover the entire top surfaces of the buried layers 116 and the cap layers 110. A second electrode 118 is formed on the backside of the substrate 102.

Thus, a semiconductor light emitting device 101 is manufactured.

In the manufacture of such a kind of a semiconductor light emitting device, when isotropic etching is performed so as to form the grooves, each of the grooves is shaped in such a way as to be tapered in cross-section plane so that an upper width W1 shown in FIG. 10A is smaller than a lower width W2 shown therein. In the case of ordinary lasers, such a tapered shape of a cross section of each of the grooves presents no problems.

SUMMARY OF THE INVENTION

However, in recent years, due to demands for high output semiconductor lasers, this tapered shape starts to have some drawbacks. In other words, smallness of the upper width W1 means that a heat dissipation path dissipating heat through the first electrode is narrow. Thus, the drawbacks associated with increase in the output thereof, such as carrier overflow, lowering of the thermal saturation level, and that of the kink level, have arisen. Also, the largeness of the lower width W2 results in the asymmetric shape of a laser spot in a surface direction.

The present invention addresses various issues associated with the method of manufacturing semiconductor light emitting devices described above.

A first method of manufacturing a semiconductor light emitting device according to an embodiment of the present invention is a method of manufacturing a ridge type semiconductor light emitting device, which is characterized by including: a process of epitaxially growing a multi-layered semiconductor layer having at least a first conductive type cladding layer, an active layer, a second conductive type first cladding layer, an etching stop layer, and a second conductive type second cladding layer on a substrate; a process of forming a ridge groove for forming a ridge; and a process of forming a current-flow barrier layer in the ridge grooves. In the first method, the process of forming ridge grooves has first and second anisotropic etching processes of performing anisotropic etching, an etching-mask forming process, and an isotropic etching process of performing anisotropic etching. In the first anisotropic etching process, an upper groove of the ridge groove is formed as a first groove in such a way as to have a depth from a surface of the multi-layered semiconductor layer and as not to cross the etching stop layer at the depth. In the etching mask forming process, an etching mask is formed on an inner surface of the first groove. In the second anisotropic etching process, the etching mask formed on a bottom section of the first groove is removed. In the isotropic etching process, a bottom groove of the ridge groove is formed as a second groove by performing etching in such a way as to be stopped by the etching stop layer. Finally, the current-flow barrier layer is selectively formed in the ridge groove.

A second method of manufacturing a semiconductor light emitting device according to an embodiment of the present invention is a method of manufacturing a ridge type semiconductor light emitting device, which is characterized by including: a process of epitaxially growing a multi-layered semiconductor layer having at least a first conductive type cladding layer, an active layer, a second conductive type first cladding layer, a first etching stop layer, a second conductive type second cladding layer, a second etching stop layer, and a second conductive type third cladding layer on a substrate; a process of forming a ridge groove for forming a ridge; and a process of forming a current-flow barrier layer in the ridge grooves. In the second method, the process of forming ridge grooves has first and second anisotropic etching processes of performing anisotropic etching, an etching-mask forming process, and an isotropic etching process of performing anisotropic etching. In the first anisotropic etching process, an upper groove of the ridge groove is formed as a first groove in such a way as to have a depth from a surface of the multi-layered semiconductor layer, as to cross the second etching stop layer at the depth, and as not to cross the first etching stop layer at the depth. In the etching mask forming process, an etching mask is formed on an inner surface of the first groove. In the second anisotropic etching process, the etching mask formed on a bottom section of the first groove is removed. In the isotropic etching process, a bottom groove of the ridge groove is formed as a second groove by performing etching in such a way as to be stopped by the first etching stop layer. Finally, the current-flow barrier layer is selectively formed in the ridge groove.

Further, in the method of manufacturing a semiconductor light emitting device according to the embodiment described above, RIE (Reactive Ion Etching) may be employed as the anisotropic etching in the first and the second anisotropic etching processes.

Furthermore, in the method of manufacturing a semiconductor light emitting device according to the embodiment described above, wet etching may be employed as the isotropic etching in the isotropic etching process.

In accordance with the first and the second methods of manufacturing a semiconductor light emitting device according to embodiments of the present invention, the upper section groove of the ridge groove is formed by etching, which maintains the verticality of the ridge by employing the anisotropic etching. Accordingly, the width of the ridge section formed between the ridge grooves can be set at a larger value. As a result, the thermal saturation level and the kink level can be improved.

Furthermore, the isotropic etching, i.e. wet etching is performed only on the bottom section of the ridge groove. Thus, the ridge groove having a predetermined depth can accurately be formed. Further, the etching, which excels in isotropy, is performed only on the bottom section of the ridge groove, within a limited depth. Accordingly, the width of the bottom section of the groove is prevented from becoming extremely small. Thus, the increase in the width W2 of the bottom section of the ridge can be suppressed. Consequently, the asymmetry in a spot shape of oscillating light, which is caused by the increase in the width W2 of the bottom section of the ridge, can be alleviated. In other words, unevenness of a radiation angle ($\theta$//) of oscillating light can be mitigated.

Further, in accordance with the first method of manufacturing a semiconductor light emitting device according to the present embodiment, single etching stop layer is used. In accordance with the second method of manufacturing a semiconductor light emitting device according to the present embodiment, two etching stop layers are used. Accordingly, the progress of etching upwardly from the bottom section of the ridge at the anisotropic etching can effectively be suppressed. Thus, it is possible to assure advantageous effect of that the width W1 of the upper section of the ridge and the verticality thereof can be maintained.

BRIEF DESCRIPTION OF THE DRAWINGS

The above and other objects, features and advantages of the present invention will become more apparent from the following description of the presently exemplary embodiment of the invention taken in conjunction with the accompanying drawings, in which.

DETAILED DESCRIPTION OF THE EMBODIMENTS

Embodiments of a method of manufacturing a semiconductor light emitting device according to the present invention is described below in a case where a semiconductor laser is manufactured by way of example. It should be noted that, however, the present invention is not limited to these embodiments.

First Embodiment

First, the first method of manufacturing a semiconductor light emitting device according to an embodiment of the present invention is described hereinbelow by referring to FIGS. 1 to 4, which are enlarged cross-sectional views illustrating processes of the first method.

In the present embodiment, first, a buffer layer 3 made of the first conductive type (for example, the n-type) GaInP, a cladding layer 4 made of the first conductive type (for instance, the n-type) AlGaInP, an active layer 5 of MQW (Multi-Quantum Well) structure made of, for example, GaInP and AlGaInP, a first cladding layer 6 made of the second conductive type (for instance, the p-type) AlGaInP, an etching stop layer 7 formed by repeating three times the formation of a 50 Å thick layer made of the second conductive type (for example, the p-type) GaInP and AlGaInP, a second cladding layer 8 made of the second conductive type (for instance, the p-type) AlGaInP, an intermediate layer 9 made of the second conductive type (for example, the p-type) AlGaInP, and a cap layer 10 made of the second conductive type (for instance, the p-type) GaAs are epitaxially grown through, for example, MOCVD on a major surface of the first conductive type substrate, for example, a substrate 2 made of the n-type GaAs).

Subsequently, a mask layer 12 serving as an etching mask in the next process and having a three-layer structure including three layers, which are 2000 Å, 2000 Å, and 2500 Å in thickness and made of $SiO_2$, SiN and $SiO_2$, respectively, is formed on the cap layer 10 of the multi-layered semiconductor layer 11 in such a way as to cover the top of the cap layer 10.

Figure 1A:
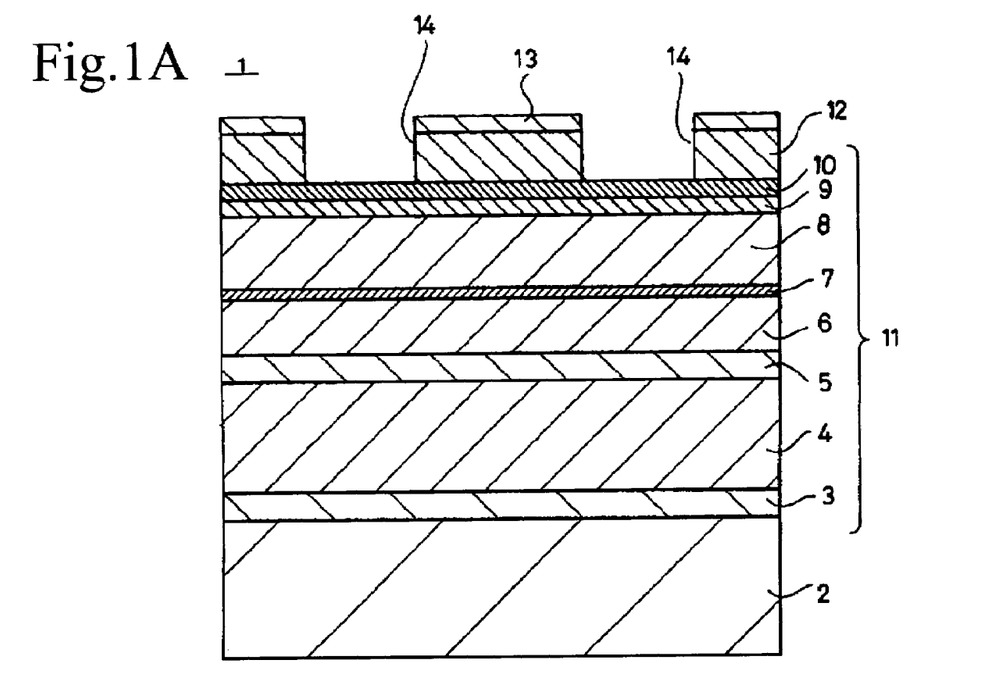
FIGS. 1A and 1B are views illustrating processes in an example of a method of manufacturing a semiconductor light emitting device according to an embodiment of the present invention.

Subsequently, patterning is performed on the mask layer 12 to thereby form openings 14 in a ridge groove formation section, as shown in FIG. 1A. In other words, a photoresist layer 13 is formed by photolithography techniques on the ridge formation section of the top layer made of $SiO_2$. Then, the top layer made of $SiO_2$ is pattern-etched. Subsequently, this $SiO_2$ layer is used as a mask to thereby sequentially pattern-etch the lower layers respectively made of SiN and $SiO_2$. Thus, the openings 14 are formed.

Figure 1B:
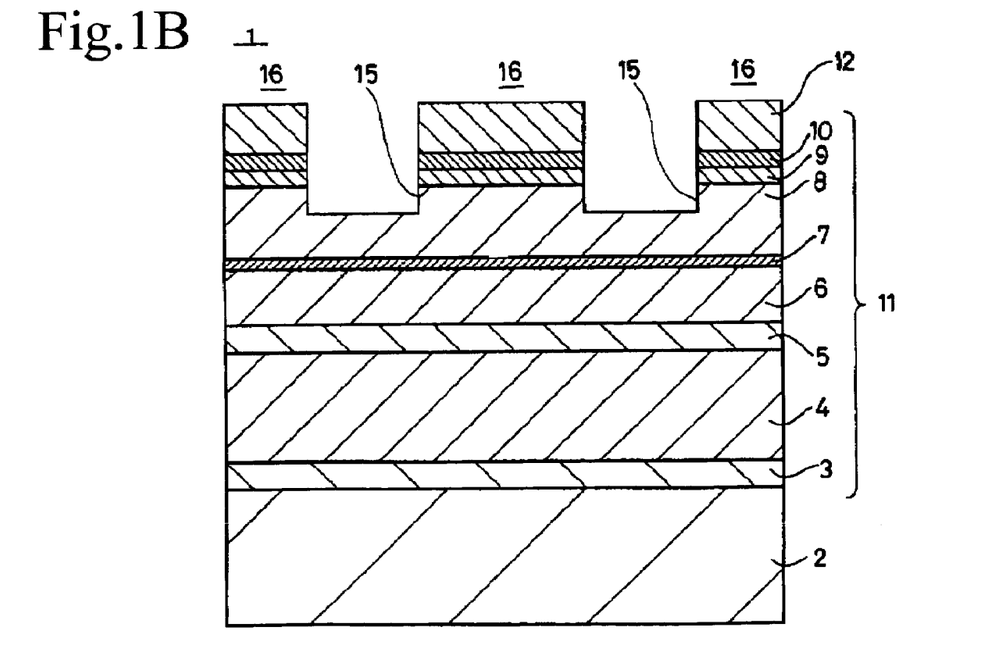

Next, as illustrated in FIG. 1B, the first anisotropic etching is performed through the openings 14 in the mask layer 12 by using, for example, RIE. Thus, the first anisotropic etching process is performed thereby to form grooves having a depth, which allows the grooves to cross the mask layer 12, the cap layer 10, and the intermediate layer 9 and to reach the second conductive type second cladding layer 8 and which does not permit the grooves to reach the etching stop layer 7, or to form upper grooves 15 of the ridge grooves to be finally formed as a first groove.

Figure 2A:
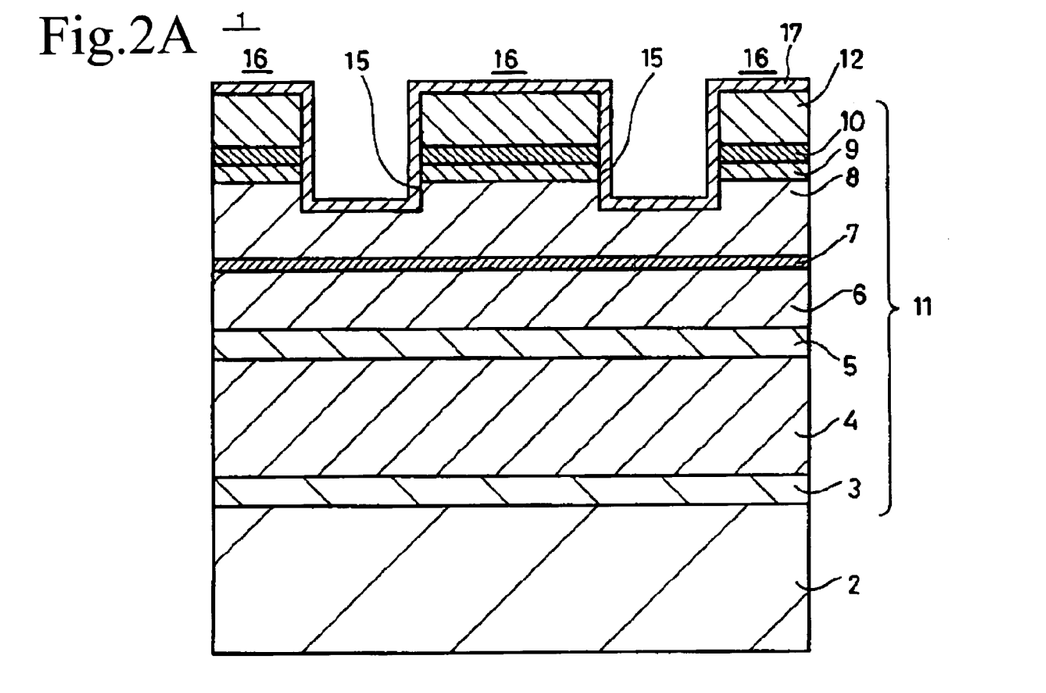
FIGS. 2A and 2B are views illustrating processes in an example of a method of manufacturing a semiconductor light emitting device according to an embodiment of the present invention.
Figure 2B:
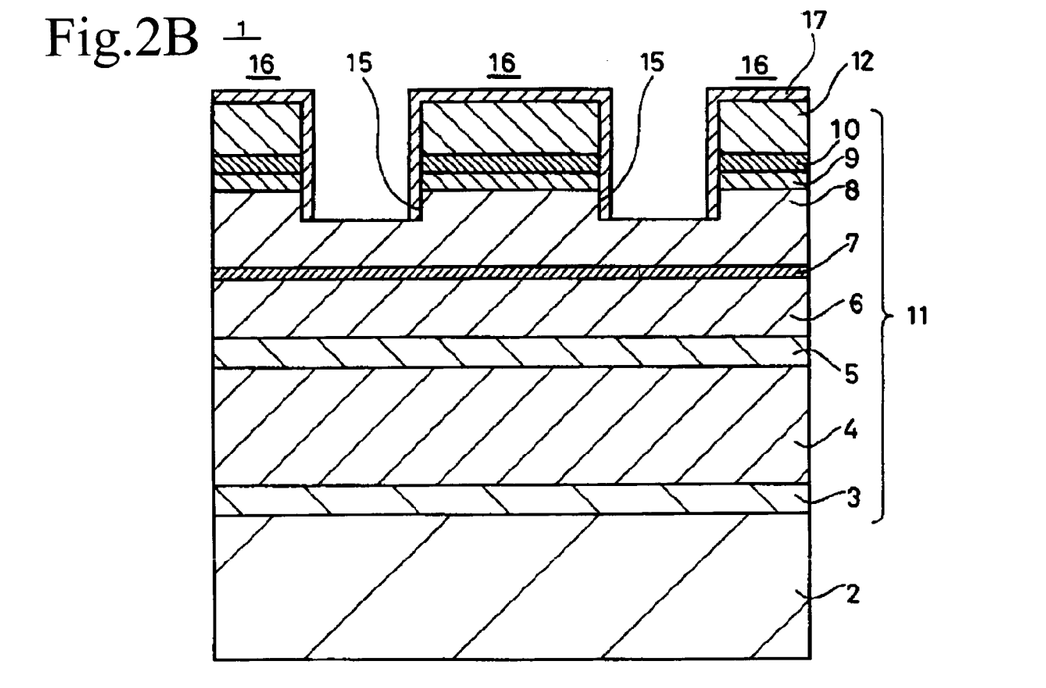

Furthermore, as illustrated in FIG. 2A, an etching mask layer 17 made of, for example, $SiO_2$ is formed in such a way as to have a thickness of 2000 Å and as to cover the ridges 16 and the first grooves 15. Also, as illustrated in FIG. 2B, the etching mask layer formed on the bottom section of each of the grooves is removed by performing the second anisotropic etching using, for instance, RIE.

Figure 3A:
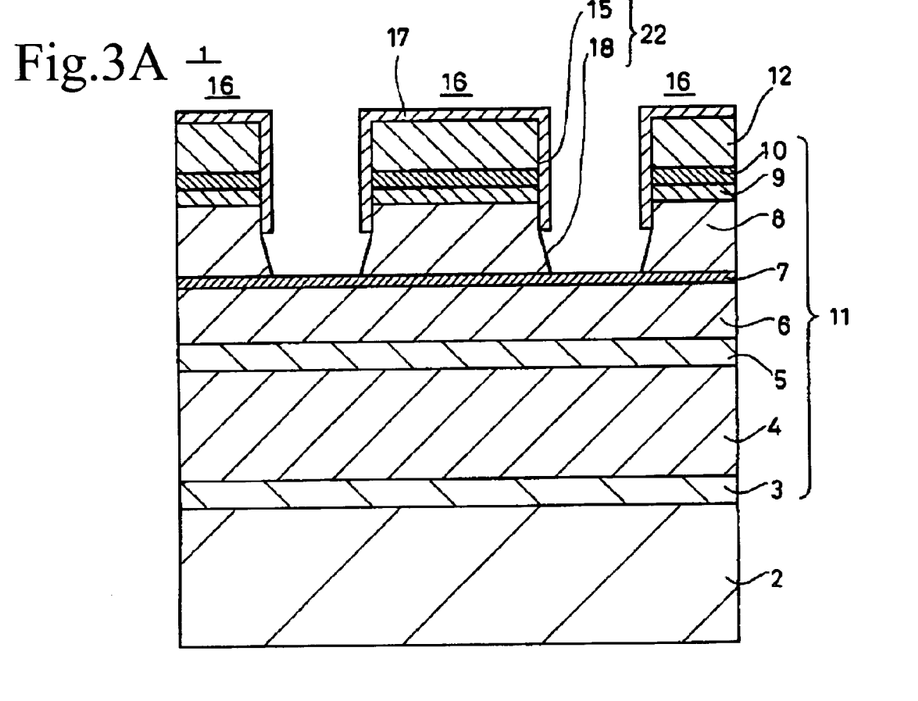
FIGS. 3A and 3B are views illustrating processes in an example of a method of manufacturing a semiconductor light emitting device according to an embodiment of the present invention.

Subsequently, the isotropic etching is performed on a region therefrom to the etching stop layer 7 by performing wet etching using, for instance, a sulfate-based etchant. Thus, as illustrated in FIG. 3A, bottom grooves are formed as second grooves 18 to thereby form the ridge grooves 22.

Figure 3B:
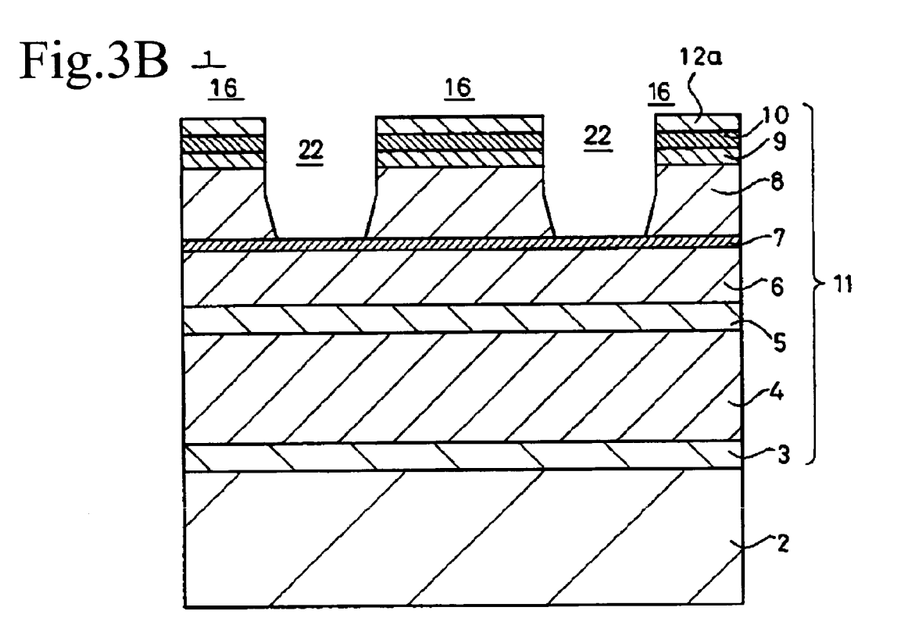

Subsequently, etching is performed on the etching mask layer 17, which is left on the top surface and the side surfaces of each of the ridges 16, and the mask layer 12 that has the three-layer structure including the $SiO_2$ layer, the SiN layer and the $SiO_2$ layer. First, the etching mask layer 17 and the $SiO_2$ layer, which is the top layer constituting the mask layer 12, are removed by a hydrofluoric-acid-based etchant. Subsequently, the SiN layer is removed by, for example, RIE. As illustrated in FIG. 3B, the $SiO_2$ layer, which is the lower layer of the mask layer 12, is left as a mask layer 12a for selective epitaxy.

Figure 4A:
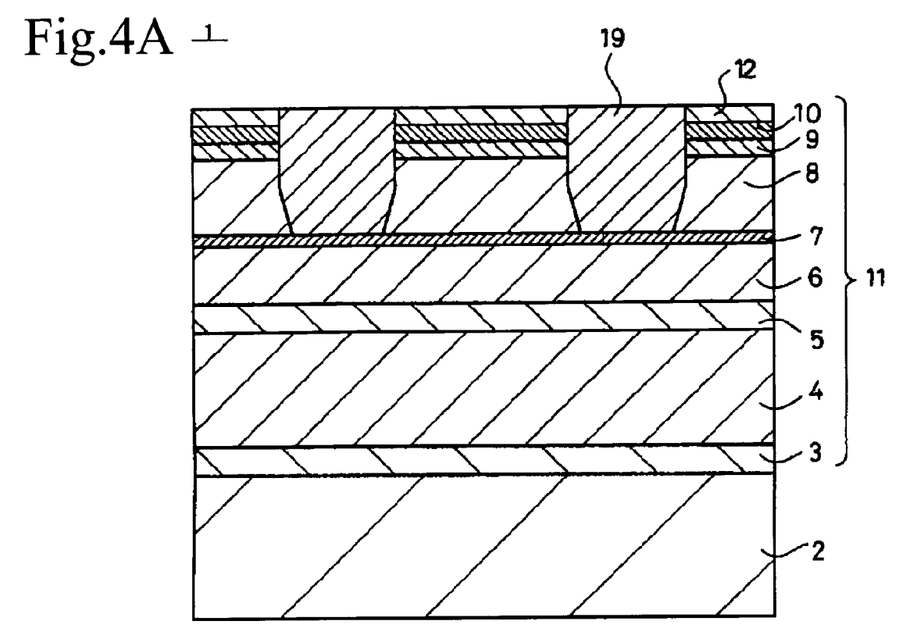
FIGS. 4A and 4B are views illustrating processes in an example of a method of manufacturing a semiconductor light emitting device according to an embodiment of the present invention.
Figure 4B:
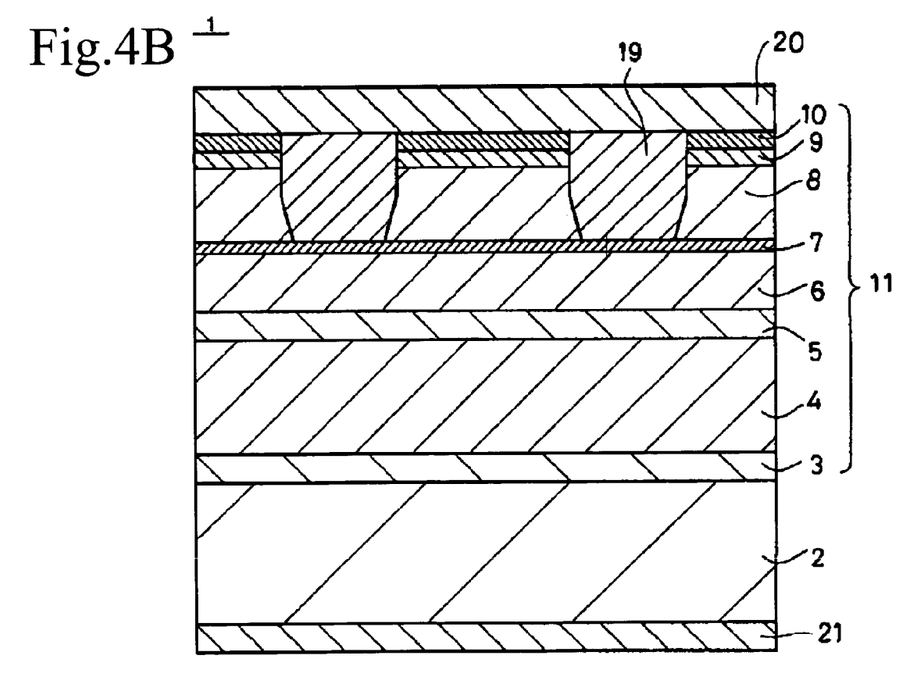

Next, as illustrated in FIG. 4A, the selective epitaxy is performed to thereby form a current-flow barrier layer 19 made of the first conductive type, for example, the n-type AlInP in each of the ridge grooves 18 other than formation sections in which the mask layers 12a are formed. Then, as illustrated in FIG. 4B, the mask 12a for selective epitaxy is removed by planarization polishing using, for instance, CMP (Chemical Mechanical Polishing). A first electrode 20 formed of a multi-layer metallic film including, for example, titanium/platinum/gold layers (Ti/Pt/Au layers), is ohmically formed on this surface in such a way as to cover this surface. Also, a second electrode 21 formed of a multi-layer metallic film, which is made of, for example, Ti/Pt/Au layers, is ohmically formed on the back surface of the substrate 2 in such a manner as to cover this surface. Thus, the ridge type semiconductor light emitting device 1 is manufactured.

Second Embodiment

The second method of manufacturing a semiconductor light emitting device according to another embodiment of the present invention is described hereinbelow by referring to FIGS. 5 to 8, which are enlarged cross-sectional views illustrating processes of the second method.

In the present embodiment, first, a buffer layer 33 made of the first conductive type (for example, the n-type) GaInP, a cladding layer 34 made of the first conductive type (for instance, the n-type) AlGaInP, an active layer 35 of MQW (Multi-Quantum Well) structure made of, for example, GaInP and AlGaInP, a first cladding layer 36 made of the second conductive type (for instance, the p-type) AlGaInP, a first etching stop layer 37 formed by repeating three times the formation of a 50 Å thick layer made of the second conductive type (for example, the p-type) GaInP and AlGaInP, a second cladding layer 38 made of the second conductive type (for instance, the p-type) AlGaInP, a second etching stop layer 39 formed by repeating three times the formation of a 50 Å thick layer made of the second conductive type (for example, the p-type) GaInP and AlGaInP, a third cladding layer 40 made of the second conductive type (for instance, the p-type) AlGaInP, an intermediate layer 41 made of the second conductive type (for example, the p-type) AlGaInP, and a cap layer 42 made of the second conductive type (for instance, the p-type) GaAs are epitaxially grown through, for example, MOCVD on a major surface of the first conductive type substrate, for example, a substrate 32 made of the n-type GaAs.

Subsequently, a mask layer 44 serving as an etching mask in the next process and having a three-layer structure including three layers, which are 2000 Å, 2000 Å, and 2500 Å in thickness and made of $SiO_2$, SiN and $SiO_2$, respectively, is formed on the cap layer 42 of the multi-layered semiconductor layer 43 in such a way as to cover the top of the cap layer 42.

Figure 5A:
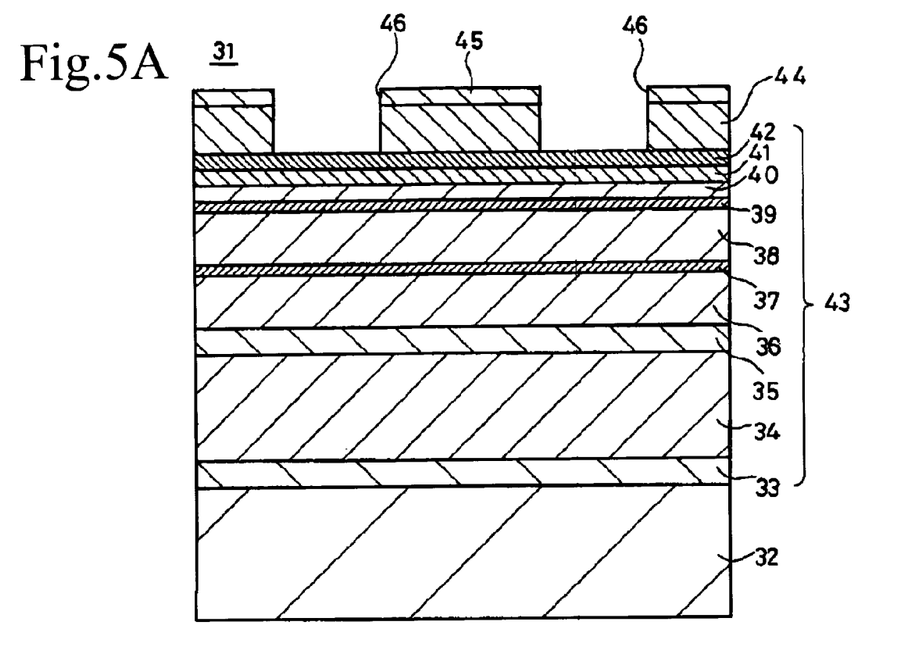
FIGS. 5A and 5B are views illustrating processes in another example of a method of manufacturing a semiconductor light emitting device according to an embodiment of the present invention.

Subsequently, patterning is performed on the mask layer 44 to thereby form openings 46 in a ridge groove formation section, as shown in FIG. 5A. In other words, a photoresist layer 45 is formed by photolithography techniques on the ridge formation section of the top layer made of $SiO_2$ in the mask layer 44. Then, this photoresist layer is used as a mask to thereby perform patterning on the top layer made of $SiO_2$. Then, this $SiO_2$ layer is used as a mask to thereby sequentially pattern-etch the lower layers respectively made of SiN and $SiO_2$.

Figure 5B:
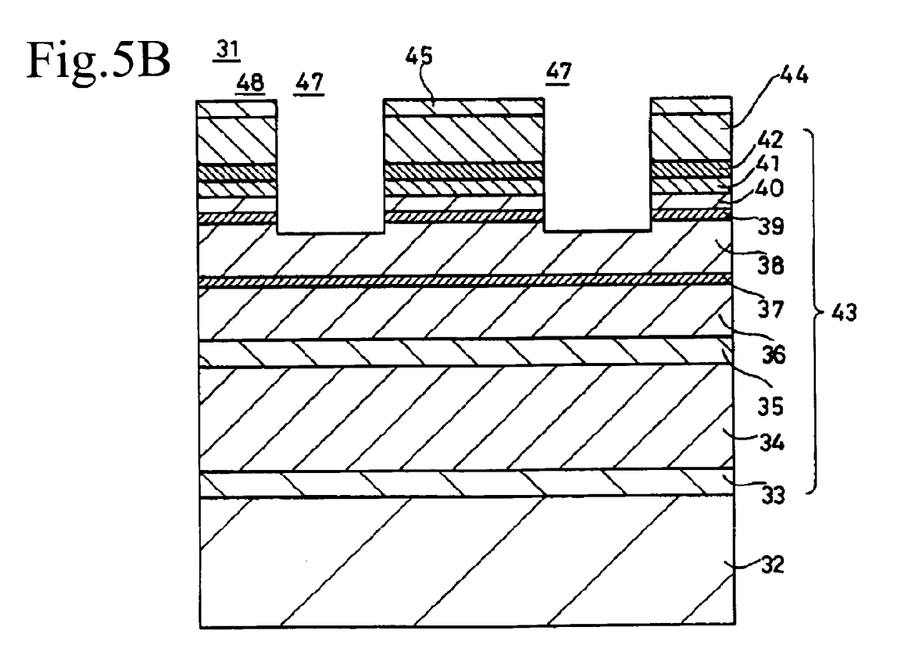

As illustrated in FIG. 5B, the first anisotropic etching is performed through the openings 46 in the mask layer 44, which has undergone the patterning, by using, for example, RIE. Thus, the first anisotropic etching process is performed thereby to form grooves having a depth, which allows the grooves to cross the mask layer 44, the cap layer 42, the intermediate layer 41, the second conductive type third cladding layer 40, and the second etching stop layer 39 and to reach the second conductive type second cladding layer 38 and which does not permit the grooves to reach the first etching stop layer 37, or to form upper grooves of the ridge grooves to be finally formed as a first groove 47.

Figure 6A:
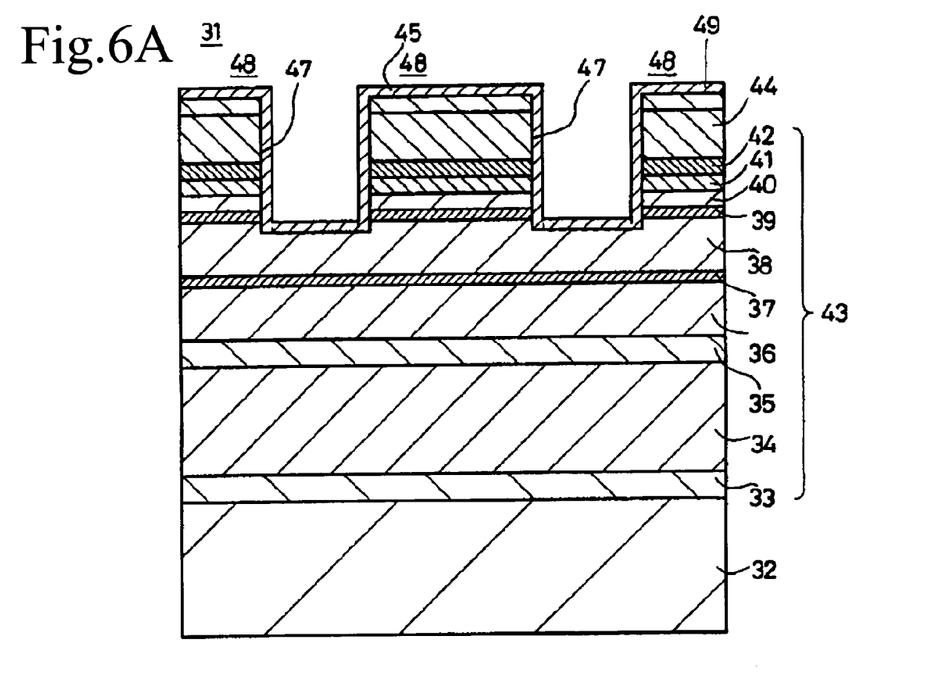
FIGS. 6A and 6B are views illustrating processes in another example of a method of manufacturing a semiconductor light emitting device according to an embodiment of the present invention.
Figure 6B:
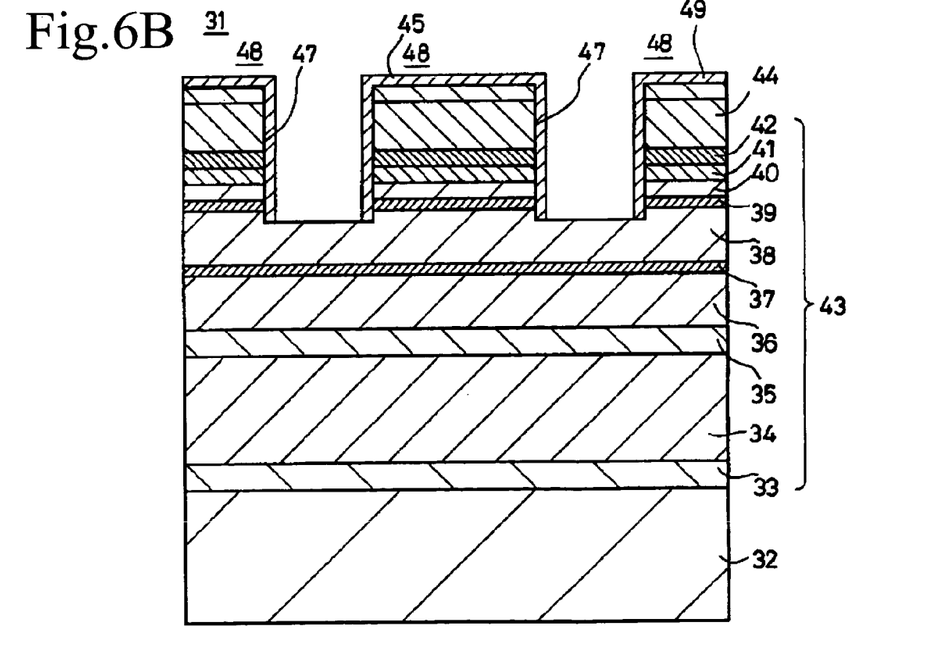
Figure 7A:
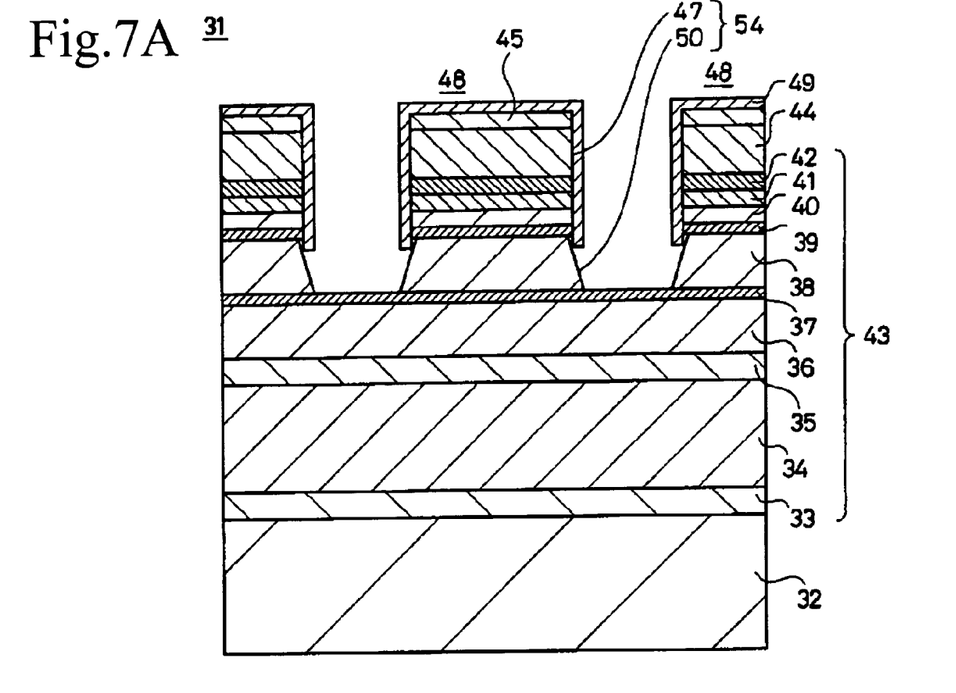
FIGS. 7A and 7B are views illustrating processes in another example of a method of manufacturing a semiconductor light emitting device according to an embodiment of the present invention.

Next, as illustrated in FIG. 6A, an etching mask layer 47 made of, for example, $SiO_2$ is formed in such a way as to cover the ridges 48 and the grooves 47. Also, as illustrated in FIG. 6B, the etching mask layer 49 formed on the bottom section of each of the grooves 47 is removed by performing the second anisotropic etching using, for instance, RIE. Subsequently, as illustrated in FIG. 7A, the isotropic etching is performed on a region therefrom to the first etching stop layer 37 by performing wet etching using, for instance, a sulfate-based etchant. Thus, bottom grooves 50 are formed as second grooves to thereby form ridge grooves 54.

At that time, the second conductive type third cladding layer 40 is protected by the second etching stop layer 39. Consequently, the shape of the entirety of each of the ridges 48 is not tapered in its cross-section. Instead, each of the ridges 48 has a vertical form.

Figure 7B:
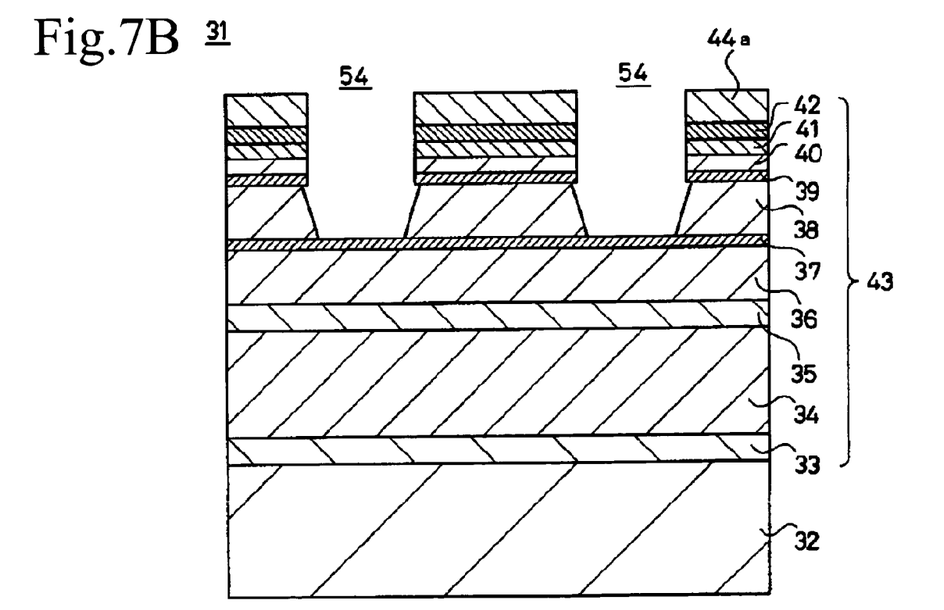

Subsequently, as illustrated in FIG. 7B, etching is performed on the etching mask layer 49, which is left on the top surface and the side surfaces of each of the ridges 48, and the mask layer 44 that has the three-layer structure including the $SiO_2$ layer, the SiN layer and the $SiO_2$ layer. First, the etching mask layer 49 and the $SiO_2$ layer, which is the top layer constituting the mask layer 44, are removed by a hydrofluoric-acid-based etchant. Subsequently, the SiN layer is removed by RIE. For example, the $SiO_2$ layer, which is the lower layer of the mask layer 44, is left as a mask layer 44a for selective epitaxy.

Figure 8A:
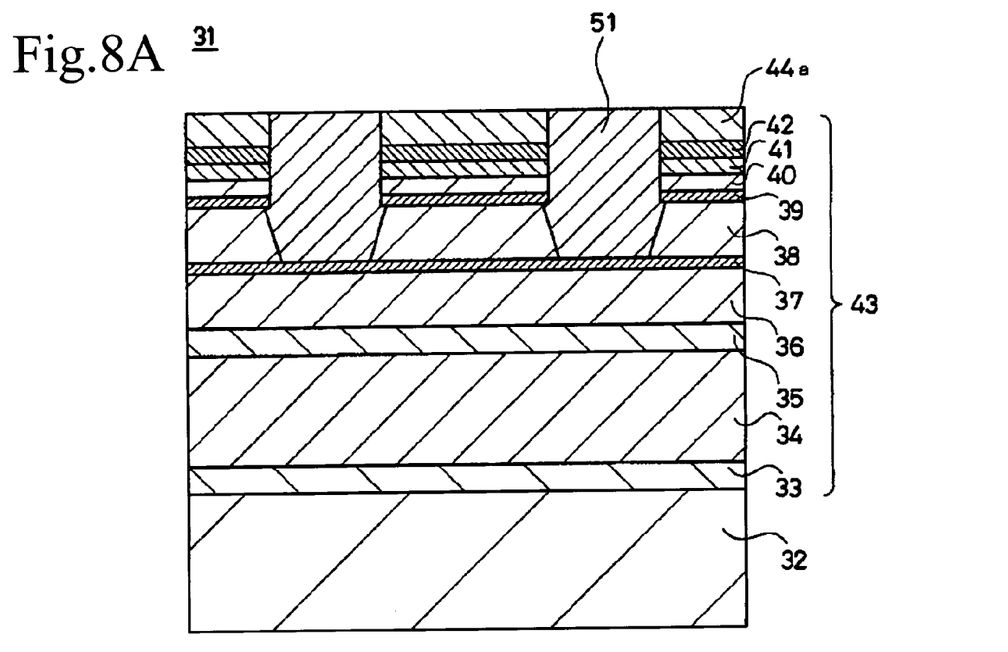
FIGS. 8A and 8B are views illustrating processes in another example of a method of manufacturing a semiconductor light emitting device according to an embodiment of the present invention.
Figure 8B:
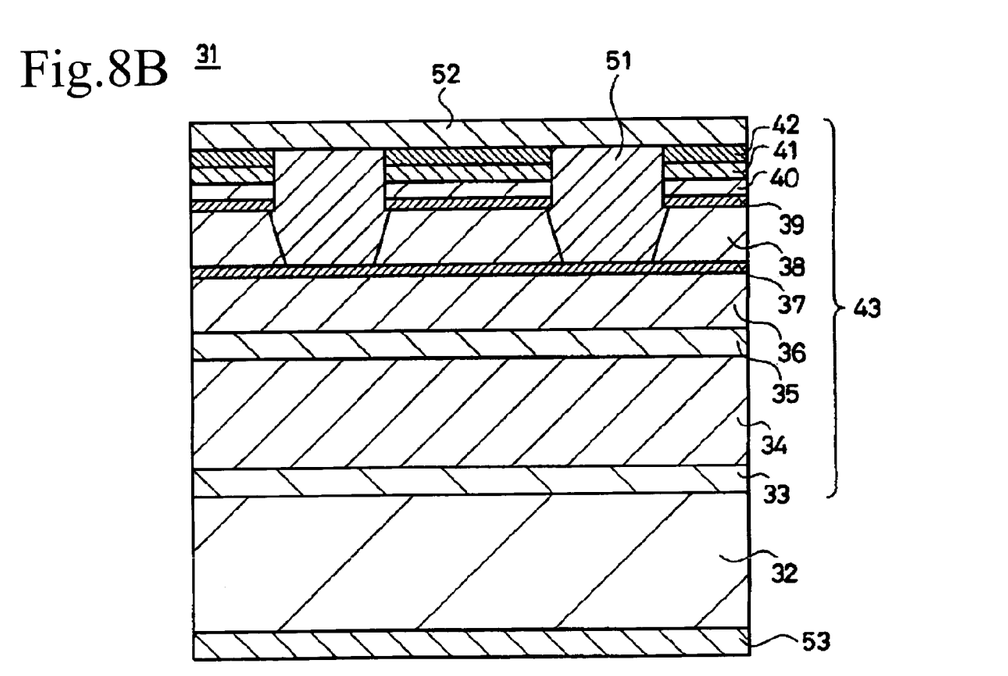

Furthermore, as illustrated in FIG. 8A, the selective epitaxy is performed to thereby form a current-flow barrier layer 51 made of the first conductive type, for example, the n-type AlInP in each of the ridge grooves 50 other than formation sections in which the mask layers 44a are formed. Then, as illustrated in FIG. 8B, the mask 44a for selective epitaxy is removed by planarization polishing using, for instance, CMP. A first electrode 52 formed of a multi-layer metallic film including, for example, Ti/Pt/Au layers is ohmically formed on this surface in such a way as to cover this surface. Also, a second electrode 53 formed of a multi-layer metallic film, which is made of, for example, Ti/Pt/Au layers, is ohmically formed on the back surface of the substrate in such a manner as to cover this surface. Thus, a ridge type semiconductor light emitting device 31 is manufactured.

Although the embodiments of the method of manufacturing a semiconductor light emitting device with examples of manufacturing a semiconductor laser have been described above, the method of manufacturing a semiconductor light emitting device according to the present invention is not limited to these embodiments.

For example, although the first conductive type and the second conductive type are respectively set to be the n-type and the p-type in the embodiments, these conductive types may be reversed.

The drawings show the case where one semiconductor light emitting element is formed on one semiconductor substrate. Alternatively, plural semiconductor light emitting devices may simultaneously be formed by forming plural semiconductor light emitting elements on a common substrate and then dividing the substrate into segments respectively having the semiconductor light emitting elements. Further, the semiconductor light emitting device may have a multi-light-emitting-element structure. Accordingly, the method according to the present invention may be applied to manufacture methods of semiconductor light emitting devices of various configurations.

Further, the method of manufacturing a semiconductor light emitting device according to the present invention may be applied to manufacturing methods of a semiconductor light emitting device such as a light emitting diode or the like, or of an integrated circuit device having a semiconductor light emitting element and another circuit element, and so on.

Furthermore, various modifications and alterations of the embodiments may be made by applying the method of the present invention to, for example, a semiconductor laser having what is called SCH (Separate Confinement Heterostructure) structure in which a guide layer is disposed between the active layer and the cladding layer.

It should be understood by those skilled in the art that various modifications, combinations, sub-combinations and alterations may occur depending on design requirements and other factors insofar as they are within the scope of the appended claims or equivalents thereof.

What is claimed is:

1. A method of manufacturing a ridge type semiconductor light emitting device, the method comprising:
   a process of epitaxially growing a multi-layered semiconductor layer having at least a first conductive type cladding layer, an active layer, a second conductive type first cladding layer, an etching stop layer, and a second conductive type second cladding layer on a substrate; a process of forming a ridge groove for forming a ridge; and
   a process of forming a current-flow barrier layer in the ridge groove,
   wherein,
   the process of forming ridge grooves has first and second anisotropic etching processes of performing anisotropic etching, an etching-mask forming process, and an isotropic etching process of performing an isotropic etching,
   in the first anisotropic etching process, an upper groove of the ridge groove is formed as a first groove in such a way as to have a depth from a surface of the multi-layered semiconductor layer and as not to cross the etching stop layer at the depth,
   in the etching mask forming process, an etching mask is formed on an inner surface of the first groove,
   in the second anisotropic etching process, the etching mask formed on a bottom section of the first groove is removed,
   in the isotropic etching process, a bottom groove of the ridge groove is formed as a second groove by performing etching in such a way as to be stopped by the etching stop layer, and
   the current-flow barrier layer is selectively formed in the ridge groove.

2. A method of manufacturing a ridge type semiconductor light emitting device, the method comprising:
   a process of epitaxially growing a multi-layered semiconductor layer having at least a first conductive type cladding layer, an active layer, a second conductive type first cladding layer, a first etching stop layer, a second conductive type second cladding layer, a second etching stop layer, and a second conductive type third cladding layer on a substrate;
   a process of forming a ridge groove for forming a ridge; and
   a process of forming a current-flow barrier layer in the ridge grooves,
   wherein,
   the process of forming ridge grooves has first and second anisotropic etching processes of performing anisotropic etching, an etching-mask forming process, and an isotropic etching process of performing an isotropic etching,
   in the first anisotropic etching process, an upper groove of the ridge groove is formed as a first groove in such a way as to have a depth from a surface of the multi-layered semiconductor layer, as to cross the second etching stop layer at the depth, and as not to cross the first etching stop layer at the depth, in the etching mask forming process, an etching mask is formed on an inner surface of the first groove, in the second anisotropic etching process, the etching mask formed on a bottom section of the first groove is removed, in the isotropic etching process, a bottom groove of the ridge groove is formed as a second groove by performing etching in such a way as to be stopped by the first etching stop layer, and the current-flow barrier layer is selectively formed in the ridge groove.

3. The method of manufacturing a semiconductor light emitting device according to claim 1 or 2, wherein the first and the second anisotropic etching processes are performed with reactive ion etching (RIE).

4. The method of manufacturing a semiconductor light emitting device according to claim 1 or 2, wherein the isotropic etching process is a wet etching process.

* * * * *